United States Patent [19]

Ballantyne et al.

[11] 3,961,102

[45] June 1, 1976

[54] SCANNING ELECTRON MICROSCOPE FABRICATION OF OPTICAL GRATINGS

[75] Inventors: Joseph M. Ballantyne; Chung L. Tang; Lawrence Bryce Rhodes; John J. Turner; Ji Liang Yang, all of Ithaca, N.Y.

[73] Assignee: Cornwell Research Foundation, Inc., Ithaca, N.Y.

[22] Filed: Sept. 13, 1974

[21] Appl. No.: 505,642

[52] U.S. Cl. .................................. 427/43; 427/273; 235/151.1
[51] Int. Cl.² ............................................ B05D 3/06
[58] Field of Search ............... 117/93.31; 235/151.1; 178/DIG. 1, DIG. 36; 427/43, 273

[56] References Cited
UNITED STATES PATENTS

| | | | |
|---|---|---|---|
| 3,535,137 | 10/1970 | Haller et al. | 117/93.31 |
| 3,679,497 | 7/1972 | Handy et al. | 117/93.31 |
| 3,681,103 | 8/1972 | Brown | 117/93.31 |
| 3,703,402 | 11/1972 | Cole | 117/93.31 |
| 3,775,592 | 11/1973 | Ando et al. | 235/151.11 |
| 3,843,875 | 10/1974 | Goodstal et al. | 235/151.11 |

*Primary Examiner*—John H. Newsome
*Attorney, Agent, or Firm*—Theodore C. Wood; Ralph R. Barnard; Lawrence E. Laubschor

[57] ABSTRACT

A method of making optical gratings by the use of a Scanning Electron Microscope wherein (1) a substrate having a thin film of electron resist thereon is exposed in adjacent areas by an electron dosage and the amount of such dosage and the depth of the thin film are selected such that energy deposition in regions between adjacent exposed areas in said electron resist is below the threshold sensitivity of said resist for development, (2) the development time of the resist is made an inverse function of the electron dosage, and/or (3) the period of the grating is controlled by use of a standard scanning format.

15 Claims, No Drawings

SCANNING ELECTRON MICROSCOPE FABRICATION OF OPTICAL GRATINGS

BACKGROUND OF THE INVENTION

Since 1969, work in the field of integrated optics has been expanding rapidly, until today it has become one of the most active fields of device research. For an account of work in the field one can consult such recent review articles as; P. K. Tien, Applied Optics 10, 2395 (1971), and E. T. Stepke, Electro-Optical System Design, P. 18, September, 1973.

The term "integrated optics" is used to describe devices (or systems which contain such devices) which interact with guided light waves. This requires that some component of the device have a dimension on the order of the wavelength of light, which is easily achieved in an optical fiber or thin film.

Current interest in thin film optical devices is due mainly to four factors: (a) potential physical advantages such as size, ruggedness, cost; (b) new device possibilities due to the ease of interacting guided light with planar periodic structures; (c) new device possibilities such as directional couplers which result from the ability to interact with waveguide modes; and (d) potential device performance benefits which result from the high light intensities which ought to be achievable in a small optical waveguide. The potential physical advantages are roughly akin to those realized in electronics when the transistor replaced the vacuum tube. The ultimate integrated optical device requires no external lenses or mirrors and, by the elimination of expensive mechanical fabrication techniques necessary to generate these discrete components together with their mountings, ought to result in a cheap and rugged unit.

The periodic structure is a basic component of a wide variety of integrated devices, including lasers, harmonic generators, parametric oscillators, modulators, beam deflectors, and band-stop filters. Indeed, in one configuration the periodic structure is the waveguide equivalent of a mirror.

Gratings and other optical structures with submicron dimensions are described in C. V. Shank and R. V. Schmidt, Appl. Phys. Lett. 23, 154 (1973).

Prior to this invention such optical gratings used in integrated devices were customarily made by exposing a photoresist to the interference fringe pattern of a laser.

The use of interference fringe patterns to produce fine periodic structures has serious limitations, for example, (1) although fringe patterns can be used to generate a series of parallel straight lines, any deviation from this pattern is extremely difficult, and (2) mass production using fringe pattern techniques would probably be inefficient.

The successful use of the Scanning Electron Microscope (SEM) in recent years to mass produce integrated electronic devices (see for example, G. R. Brewer "Electron and Ion Beams in Microelectronic Fabrication Process, Solid State Technology," pp. 36–39, July, 1972, and also Solid State Technology, pp. 43–47, August, 1972.) and complex accoustical structures (see for example, R. F. Henzog, High Resolution Electron Beam Fabrication, Record of the 10 Symposium on Electron, Ion and Laser Beam Techniques, Gaithersburg, Md., U.S.A. 21–23, May, 1969, pp. 107–114.) suggests its use in fabrication of fine periodic structures for optical use. "Ion Beam Micromachining of Integrated Optics Components," an article by Garvin, et al. in Applied Optics 12:3, 455 describes Corrugation in Optical Waveguides, which are said to have been made by SEM techniques.

When SEM was employed to fabricate periodic structures having significant optical properties it was discovered that pattern density imposes serious considerations upon exposing and developing of the electronic-resist, electron scattering charactertistics of the structure greatly influence the allowable beam current, and the period of the structure must be precisely controlled during fabrication.

Since SEM fabrication of optical structures can be computer controlled it is possible to fabricate much more complicated periodic structures, which might for instance consist of curved lines or of pairs of lines separated by greater distance or might consist of a grating plus a waveguide, both delineated by the position of the electron beam, and many devices on a single chip of substrate.

SUMMARY OF THE INVENTION

In accordance with the principles of this invention a Scanning Electron Microscope (SEM) is used in the fabrication of optical gratings. The exposure of the electron-resist is a function of the grating periods, the processing time and detailed steps for developing the resist is a function of the grating periods, and a size standard is employed to control the overall absolute size of the grating and thereby control its period.

DESCRIPTION OF THE INVENTION

Information concerning this invention has been published in Appl. Physics Letters September 1973 and IEEE Journal of Quantum Electronics, March, 1974, and is hereby incorporated by reference.

In accordance with the principles of this invention gratings and other optical structures with submicron dimension are fabricated by the exposure of an electron resist (polymethylmethacrylate, PPM, which is the chemical name for Lucite) in a scanning electron microscope (SEM). Because the electron beam is under electronic control, this method possesses great flexibility for fabricating a variety of different patterns. Under electron bombardment, the molecular weight of the PPM is reduced, allowing exposed areas to be dissolved with a preferential solvent (e.g., 1:3 mixture by volume of methyl isobutyl ketone and isopropyl alcohol).

Because of electron scattering in the PPM and substrate the electron dosage for proper grating exposure depends on the grating period, as does the development process.

The gratings are formed in a layer of polymethylmethacrylate (PPM) on a suitable substance. The PPM layer is a thin film generaly less than 3500 A thick.

An electron resist is a material whose solubility in appropriate developer solution is changed by exposure to electron doses less than $10^{-3} C/cm^2$.

A positive electron resist is a material whose solubility in a developing solution is increased by exposure to the electron beam so that exposed portions of the resist are removed on development. A negative resist is a material which cross-links under electron bombardment so that its solubility in the developing solution is decreased by exposure to the electron beam. Hence, the unexposed portions of the negative resist are removed on development, while the exposed portions remain.

Some positive electron resists (irradiated region removed on development) as given by Haller, et al., IBM JRD 12, 251 (1968) are as follows:

TABLE I

| | Minimum Exposure at 10 KV |
|---|---|
| CA | $5\times10^{-4}$ C/cm$^2$ |
| IB | $5\times10^{-5}$ C/cm$^2$ |
| MS | $1\times10^{-4}$ C/cm$^2$ |
| PMM | $5\times10^{-5}$ C/cm$^2$ |

Of the above, the PMM is preferred because of its resolution and durability.

The best negative resist found to date is poly(GMA-co-EA)5, a copolymer of poly (glycidyl methacrylate) and ethyl acrylate. At 10 KV, the minimum exposure is $4\times10^{-7}$ C/cm$^2$, as given in Applied Optics, 13, 1695 (1974). Other negative resists are poly(gylcidyl methacrylate) (PGMA) with sensitivity $2\times10^{-7}$ C/cm$^2$, and epoxidized polybutadience (EPB) with sensitivity of $4\times10^{-7}$ C/cm$^2$.

The efficiency of a grating depends on both the shape and the depth of the groove produced when the resist is exposed and developed. It is much easier to control and predict the depth than the shape because of backscattering of electrons. In thick films of resist (thickness greater than the depth of significant electron penetration) the highest efficiency of the grating from the standpoint of "depth" of the groove ($d$) is when the depth is maximum under the condition that the width of the groove at its maximum dimension ($w$) is less than one-half of the period of the grating.

For fine gratings, thin films of resist are used and electron penetration goes well into the substrate where electron scattering goes well beyond the width of the groove in the resist and the depth of the groove is equal to the thickness of the thin film resist. The optimum exposure and development depend on the molecular weight of the PMM. DuPont Elvacite 2008, with lower molecular weight than 2041, requires a lower dose. Esschem PMM type 12 with molecular weight 950,000 is almost identical to 2041 in exposure and development.

The efficiency of the integrated optical devices depends on the quality of the gratings. Gratings are made by:

1. cleaning the surface of the structure upon which the grating is to be made,
2. applying an electron resist coating to the surface of the structure,
3. mounting the structure having the electron resist and an overall pattern size standard in the object stage of a Scanning Electron Microscope,
4. adjusting the step and variable magnification controls so that the overall size of the raster conforms to the overall pattern size standard,
5. deflecting the beam onto the electron resist at a rate such that the electron dose is a function of the grating pattern density, and
6. developing the electron resist coating for a time period which is an inverse function of the grating pattern density.

Cleaning the surface of the structure upon which the grating is to be made

For most optical materials this may be accomplished by washing the surface with soap and water including scrubbing the surface with a cotton swab or other scrubber dipped in soap solution. Following the scrubbing, the surface may be immersed in an ultrasonic bath of detergent solution for a few minutes followed by several ultrasonic rinses in distilled water till the soap residues have been removed. This may be followed by ultrasonic cleaning in electronic grade trichlorethylene, ultrasonic cleaning in electronic grade acetone, and ultrasonic cleaning in electronic grade methanol. Each solvent may be rinsed off two or three times with a succeeding solvent before the ultrasonic cleaning. Following the methanol cleaning the substrates may be blown dry with filtered warm nitrogen and placed in a clean environment for storage prior to coating.

Applying an electron-resist coating to the surface of the structure

The electron-resist may be applied by spin-coating a thin layer of Dupont Elvacite 2041. This is accomplished by placing the sample on the head of a photoresist spinner, flooding the surface of the sample with a solution of 4½% Elvacite 2041 in methyl-isobutyl ketone, and turning on the spinner to the desired speed for 30 to 60 seconds until the spun film has air dried. For optical gratings a thickness of about 2000A or PPM is desired which corresponds to a spinner velocity of about 5000 RPM. For this elvacite solution the thickness can be computed from an approximate formula that the thickness in A is equal to 158,000 divided by the square root of the spin speed in revolutions per minute. For producing optical gratings the thickness of the resist is somewhat critical. The thickness must generally be about the same or less than the period of the desired grating. After coating, the resist is hardened by baking it for 1 hour at 150°C in an oven. If the substrate is non-conducting the resist must be coated with a very thin layer of aluminum to prevent charging in the scanning microscope. This layer is vacuum deposited from a heated filament to a thickness of approximately 100A. If the substrate is conducting this thin layer of aluminum is unnecessary and the samples are ready to be exposed in the scanning microscope.

Mounting the structure having the electron resist and an overall pattern size standard in the object stage of a SEM.

The sample must be mounted on the SEM stage so that its surface is perpendicular to the electron beam. This is done by mounting the sample on a holder which subsequently screws into the microscope stage, in such a manner that its surface is perpendicular to the axis of the holder. The overall pattern size standards are required in order that accuracy of the grating period can be maintained. The standard may take many forms but one which has been used successfully consists of a grid of chromium lines deposited on a glass substrate which was coated with a thin aluminum film to prevent charging. The lines were 10$\mu$ wide with a period of 100$\mu$, with all dimensions having ± 1-$\mu$ noncumulative error. With such a standard, the absolute value of the line spacing could be set to an accuracy (checked experimentally by measuring the Bragg diffraction angles) of better than 0.2%. This accuracy is particularly important if the grating is to be used as the resonant feedback structure of, for example, semiconductor lasers. The surfaces of the samples and standard gratings all lie in a single plane, to within an accuracy of a few microns.

After the sample is mounted on the sample holder, the sample holder is inserted into the stage of the microscope and the microscope stage is leveled with a bubble level, to insure that the sample surface is approximately perpendicular to the axis of the beam. On many samples there is some preferred microscopic orientation which may be a cleaved edge of the sample or a predetermined axis for the gratings. A grating axis should be aligned along the Y-direction of the SEM objective stage, because the raster scans the grating lines parallel to the X-direction. This can be done in a coarse manner by visual observation of the sample as it is rotated using the mechanical stage controls. The microscope is now placed in the chamber, and the system pumped down.

Adjusting the magnification so that the overall size of the raster conforms to the overall pattern size standard The magnification is calibrated by rotating the stage using mechanical stage rotation until the lines of the standard are square with the raster and then adjusting the step and zoom magnification control until the first and last scan lines correspond with the appropriate lines on the standard. The beam is then refocused for a sharp focus on the standard for a magnification at least 10 times higher than will be used for the subsequent exposures. At this point a fine adjustment of the tilt of a sample can be made by mechanically translating between the two standard gratings in the sample holder, and observing the focus on each grating. Mechanical stage controls can be adjusted so that both gratings are in focus without additional changes in the electrical focus. Following this fine tilt adjustment the field of view and focus should be checked on one grating, as indicated above. The final adjustment of the zoom magnification control should be made on a slow display speed for the best resolution. The zoom magnification control should not be touched henceforth.

The fine adjustment of the sample orientation can now be accomplished. On some devices it is necessary that several gratings precisely aligned with each other be fabricated. In order that this may be accomplished it is necessary that the microscope scan be precisely perpendicular to the Y-direction of the mechanical motion of the SEM. This is accomplished by observing some artifact not in the region of final sample exposure, and placing this artifact on the edge of the raster, using the working magnification. The stage rotation is then adjusted until motion along the Y-axis does not move the artifact away from the raster edge. Then using only the step magnification controls the magnification is reduced until the artifact remains along the raster edge for the maximum possible translation along the Y-direction. Care must be exercised at low magnification to allow for lens edge effects. For fine positioning of items within the sample area a fine mapping of the sample corners can be undertaken. Using the exposure magnification the coordinates of the sample corners can be noted by recording their locations using the stage micrometers. Care must be taken not to allow the beam to penetrate to the interior of the sample where the final exposure will be made. These micrometer readings allow the sample to be accurately positioned when operating without beam current.

A sample may now be focused. Translate to an area of the sample which will not be exposed and create a burn-pattern on the sample by increasing the magnification to 20 times the operating magnification using the step-controls only. Restrict the raster to partial field. The intense current density will cause a portion of the PMM to be deformed slightly. Reduce the magnification to ten times operating magnification and observe the edges of this disturbance, which are near the actual surface of the PMM. The edges of this disturbance should be well in focus. If not, a slight correction in the focus can be made. This, however, will likely change the magnification slightly so that the actual grating period will be different from that predicted. During the final focusing step magnification controls can be used but the continuous magnification control must not be touched. The beam should now be blanked, the step magnification returned to that which will be used for exposure, and the region on the sample to be exposed positioned under the beam using the previously determined sample coordinates.

Deflecting the beam onto the photo resist at a rate such that the electron dose is a function of the grating pattern density The electron dose for $2\mu$ thick PMM, 20 KeV, aluminum substrate has been predicted by J. S. Greeneich and T. Van Duzer, "Model for exposure of electron-sensitive resists," in *Rec. 12th Symp. Electron, Ion, and Laser Beam Technology* (Cambridge, Mass.) May 21–23, 1973.

Since the discovery that the exposure, the thickness of resist coating and development time used in gratings are interrelated, it has been determined that the electron dose in optical structures is significantly influenced by the grating pattern density and therefore differs materially from that predicted for other structures.

In a series of exposures on GaAs, there are differences in diffraction efficiency for doses 10 percent away from predicted optimum and control of the dose to one part in $10^{-10}$ C/cm is desirable and possible. Optimum exposures for gratings with a variety of periods on both insulating and semiconducting substrates are shown in Table II. Semiconductor samples do not require an aluminum overlayer on the PMM, since deposited charge can leak off through the substrate. For gratings with periods less than 400 nm, the aluminum thickness has a significant effect on exposure. Data in Table II are for PMM layers between 120 and 220 nm in thickness and development time of about 25–30 seconds. PMM thickness variations in this range have only small effect on the optimum exposure. Comparison is made between optimum exposure with the theoretical predictions of Greeneich and Van Duzer, which were made on the basis of a mathematical model that included single scattering events in the PMM film and in the substrate. It is seen that the experimental optimum exposure falls well within the theoretical values; however, typical exposure latitude for gratings with a 350-nm period on GaAs is $10-13\times10^{-10}$ C/cm$^2$, which is considerably smaller than the $3.2-19\times10^{-10}$ C/cm$^2$ range given by the theory for a period of 250nm and resist thickness 200nm on aluminum substrate. It was discovered that the theoretical prediction, however, is a strong function of the substrate material. For a 250-nm-period grating in 400-nm-thick resist on copper, the predicted latitude is between 4.9 and $7.7 \times 10^{-10}$ C/cm². It was also discovered that the effect of scattering in the substrate varies inversely with the penetration depth, which scales roughly with density, on which basis GaAs should lie between aluminum and copper in scattering power and glass should be roughly equivalent to aluminum. This trend is born out by the data. It has been found that the exposure latitude increases with grating period. Because of the small exposure required, very reasonable exposure times between ½ and 3 min. are typical for gratings that range from 0.4 to 0.7 mm square. Largest gratings are limited by beam aberrations.

Table II is experimental data taken for 21-kV electrons and 0.12–0.22-$\mu$-thick PMM. Numbers ($q_1$) in units of $10^{-10}$ C/cm² as measured by substrate current. The range between minimum and maximum $q_1$ is where reasonably good gratings have been obtained.

TABLE II

Grating Exposure Experimental Data

| Semiconducting GaAs or $Ga_xAl_{1-x}As$ substrates | | | Insulating Glass or $Al_2O_3$ substrate Al overlayer present | | | Theoretical Prediction for .2$\mu$ thick PMM, 20 KeV, Aluminum substrate $^a$ | | |
|---|---|---|---|---|---|---|---|---|
| Grating Period | Optimum | Minimum | Maximum | Optimum | Minimum | Maximum | Period | Minimum | Maximum |
| nm | $q_1$ | $q_1$ | $q_1$ | $q_1$ | $q_1$ | $q_1$ | nm | $q_1$ | $q_1$ |
| 236 | 6 | | | | | | | | |
| 345 | | | | | | | 250 | 3.2 | 19 |
| 350 | 11–12 | 10 | 13.5 | 11 | 7.5 | 15 | | | |
| 440 | | | | | | 40 | | | |
| 465 | 14 | | 19 | | | | | | |
| 600 | | | | 12–25 | 10 | 70 | 500 | 3.5 | 40 |
| 1000 | | | | 50–75 | | | 1000 | 3.6 | 81 |
| 1700 | | | | 50–70 | | | | | |
| 2500 | | | | 75 | | | | | |

It is to be understood that the exposure data of Table II is for those instances where the development time has been selected as about 25–30 seconds. However the development time has also been determined to be a function of electron dosage. For example, a grating having a period of 330 nm and having satisfactory optical properties may be produced when the dosage and development times are selected as indicated by Table III:

TABLE III

| Dose $Q_l$ ($10^{-10}$ Coul/cm²) | Development Time in seconds |
|---|---|
| 200 | 5 or less |
| 175 | 7 or less |
| 150 | 8–10 |
| 140 | 6–12 |
| 120 | 10–20 |
| 100 | 15–30 |
| 80 | 28–37 |
| 60 | 35 or more |
| 40 | 38 or more |
| 20 | 40 or more |

It can be seen from the above that the optimum efficiency grating for one having a given period requires (1) selection of the proper electron dosage for the resist, as a function of the grating period, (2) the correct selection of the proper development time according to the desired electron dosage grating period, and (3) the correct selection of the appropriate resist film thickness. It can also be seen from the above that the accurate control of the desired grating period can be established by the use of a standard against which the scan of the Electron Microscope is adjusted. For example, by experimentation and testing it has been determined that a grating having a period of 330 nm having an optimum efficiency produced by SEM techniques employes:

1. a dosage of between 100–120($10^{-10}$ Coul/cm²)
2. an exposure time of 20–25 seconds, and
3. a resist film thickness of less that 3500 A.

While the preferred forms and embodiments of the intention have been described, various modifications may be made without deviating from the inventive concepts set forth herein.

What is claimed is:

1. In the method of making optical gratings which includes the steps of (1) providing a structure having a substrate with a film of electron resist material thereon, (2) exposing adjacent areas by electron dosage, and (3) developing the electron resist; the improvement which comprises:
    a. determining the electron scattering characteristics of said substrate and said film as an inverse function of their densities, and
    b. selecting values for resist thickness and electron dosage such that, for a given grating period, the total energy deposited by the electron beam (including scattered as well as unscattered electrons) will cause the resist in the areas of the grating lines and the resist in the areas between grating lines to react differently to a substantial degree during development, the electron beam penetration being such that when the depth of the groove produced when the resist is exposed and developed is at its maximum dimension, the width of the groove at its maximum dimension is less than one-half of the period of the grating.

2. In the method of making optical gratings which includes the steps of (1) providing a structure having a substrate with a film of electron resist material thereon, (2) exposing adjacent areas by electron dosage, and (3) developing the electron resist; the improvement which comprises:
    selecting a time period for said developing of the electron resist as an inverse function of the electron dosage, the electron beam penetration being such that when the depth of the groove produced when the resist is exposed and developed is at its maximum dimension, the width of the groove at its maximum dimension is less than one-half of the period of the grating.

3. In the method of making optical gratings which includes the steps of (1) providing a structure having a substrate with a film of electron resist material thereon, (2) exposing adjacent areas by electron dosage, and (3) developing the electron resist; the improvement which comprises:
 a. determining the electron scattering characteristics of said substrate and said film as an inverse function of its density,
 b. selecting values for resist thickness and electron dosage such that, for a given grating period, the total energy deposited by the electron beam (including scattered as well as unscattered electrons) will cause the resist in the areas of the grating lines and the resist in the areas between grating lines to react differently to a substantial degree during development, and
 c. selecting a time period for said developing of the electron resist as an inverse function of the electron dosage, the electron beam penetration being such that when the depth of the groove produced when the resist is exposed and developed is at its maximum dimension, the width of the groove at its maximum dimension is less than one-half of the period of the grating.

4. A method of operating a scanning electron microscope which includes the steps of (1) adjusting the scan pattern by observing the scan of a standard of known absolute dimensions such that known positions of the electron beam are made to correspond to some absolute dimensions of the standard and (2) causing the scan pattern so adjusted to strike the target area such that the known positions of the electron beam correspond to the same absolute dimensions as on the standard, the electron beam penetration being such that when the depth of the groove produced when the resist is exposed and developed is at its maximum dimension, the width of the groove at its maximum dimension is less than one-half of the period of the grating.

5. A method of making optical gratings by the use of a scanning electron microscope which includes the steps of (1) adjusting the scan pattern by observing the scan on a known dimension standard, and (2) causing the adjusted scan pattern to expose the electron resist of said optical grating to thereby produce a grating having a predetermined period, the electron beam penetration being such that when the depth of the groove produced when the resist is exposed and developed is at its maximum dimension the width of the groove at its maximum dimension is less than one-half of the period of the grating.

6. The method of claim 1 wherein the electron resist is of the negative type whereby the areas of the grating lines will receive sufficient energy for cross-linking and areas between the grating lines will receive insufficient energy for cross-linking.

7. The method of claim 1 wherein the electron resist is of the positive type whereby the areas of the grating lines will receive sufficient energy for development and areas between the grating lines will receive insufficient energy for development.

8. The method of claim 7 wherein the period of said grating is selected within the range of 90–2500 nm, the thickness of said thin film of electron resist is less than 3500 A, and the dosage is selected within the range of $(2-75) \times 10^{-10}$ C/cm$^2$.

9. The method of claim 3 wherein the period of said grating is selected within the range of 300–375 nm, the dosage is selected within the range of $(6-16) \times 10^{-10}$ C/cm$^2$, and the time for developing said resist is selected within the range 8–40 seconds.

10. The method of claim 1 wherein the grating lines are non-uniformly spaced.

11. The method of claim 1 wherein the grating lines are non-straight lines.

12. A product produced by the method of claim 1.

13. A product produced by the method of claim 2.

14. A product produced by the method of claim 3.

15. A product produced by the method of claim 5.

* * * * *

UNITED STATES PATENT AND TRADEMARK OFFICE
CERTIFICATE OF CORRECTION

PATENT NO. : 3,961,102
DATED : June 1, 1976
INVENTOR(S) : Joseph M. Ballantyne et al.

It is certified that error appears in the above-identified patent and that said Letters Patent are hereby corrected as shown below:

In the heading, correct the Assignee's name to read:

-- Cornell Research Foundation, Inc. --

Col. 1, after "BACKGROUND OF THE INVENTION", add:

-- The United States Government has rights in this invention pursuant to Grant No. GK33848 awarded by the National Science Foundation.--

Signed and Sealed this

Fourteenth Day of September 1976

[SEAL]

Attest:

RUTH C. MASON
Attesting Officer

C. MARSHALL DANN
Commissioner of Patents and Trademarks